(12) United States Patent
Cheng et al.

(10) Patent No.: US 10,243,061 B1
(45) Date of Patent: Mar. 26, 2019

(54) NANOSHEET TRANSISTOR

(71) Applicant: International Business Machines Corporation, Armonk, NY (US)

(72) Inventors: Kangguo Cheng, Schenectady, NY (US); Juntao Li, Cohoes, NY (US); Heng Wu, Guilderland, NY (US); Peng Xu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/814,376

(22) Filed: Nov. 15, 2017

(51) Int. Cl.
| | |
|---|---|
| H01L 21/336 | (2006.01) |
| H01L 29/66 | (2006.01) |
| H01L 29/06 | (2006.01) |
| H01L 29/40 | (2006.01) |
| H01L 29/78 | (2006.01) |
| H01L 29/423 | (2006.01) |
| H01L 23/31 | (2006.01) |
| H01L 23/29 | (2006.01) |
| H01L 21/02 | (2006.01) |
| H01L 21/311 | (2006.01) |

(52) U.S. Cl.
CPC .... *H01L 29/6656* (2013.01); *H01L 21/02164* (2013.01); *H01L 21/02236* (2013.01); *H01L 23/291* (2013.01); *H01L 23/3171* (2013.01); *H01L 29/0653* (2013.01); *H01L 29/0673* (2013.01); *H01L 29/401* (2013.01); *H01L 29/42392* (2013.01); *H01L 29/6681* (2013.01); *H01L 29/66553* (2013.01); *H01L 29/7853* (2013.01); *H01L 21/31116* (2013.01)

(58) Field of Classification Search
None
See application file for complete search history.

(56) References Cited

U.S. PATENT DOCUMENTS

| | | | |
|---|---|---|---|
| 8,778,768 B1 | 7/2014 | Chang et al. | |
| 9,121,820 B2 | 9/2015 | Liu et al. | |
| 9,287,357 B2 | 3/2016 | Rodder et al. | |
| 2008/0191317 A1 | 8/2008 | Cohen et al. | |
| 2014/0264280 A1* | 9/2014 | Kim | H01L 29/785 |
| | | | 257/29 |
| 2015/0295084 A1 | 10/2015 | Obradovic et al. | |
| 2016/0027929 A1 | 1/2016 | Cheng et al. | |
| 2016/0049489 A1* | 2/2016 | Wan | H01L 29/42392 |
| | | | 257/347 |
| 2016/0071729 A1 | 3/2016 | Hatcher et al. | |

(Continued)

OTHER PUBLICATIONS

Masanon Tanaka et al., Abnormal oxidation characteristics of SiGe/Si-on-insulator structures depending on piled-up Ge fraction at SiO2/SiGe interface, Journal of Applied Physics 103, 2008, pp. 054909-1 to 054909-5.

(Continued)

*Primary Examiner* — Kevin M Picardat
(74) *Attorney, Agent, or Firm* — Vazken Alexanian; Otterstedt, Ellenbogen & Kammer, LLP

(57) ABSTRACT

Inner and outer spacers for nanosheet transistors are formed using techniques that improve junction uniformity. One nanosheet transistor device includes outer spacers and an interlevel dielectric layer liner made from the same material. A second nanosheet transistor device includes outer spacers, inner spacers and an interlevel dielectric layer liner that are all made from the same material.

13 Claims, 10 Drawing Sheets

(56) References Cited

U.S. PATENT DOCUMENTS

| | | | |
|---|---|---|---|
| 2016/0118483 A1* | 4/2016 | Flachowsky | H01L 29/66818 257/192 |
| 2017/0092765 A1* | 3/2017 | Doris | H01L 29/7851 |
| 2017/0117360 A1* | 4/2017 | Ando | H01L 27/0922 |
| 2017/0141112 A1* | 5/2017 | Ching | H01L 27/0924 |
| 2017/0358457 A1* | 12/2017 | Jang | H01L 21/2633 |
| 2017/0358665 A1* | 12/2017 | Song | H01L 29/0676 |

OTHER PUBLICATIONS

D. Benoit et al., Interest of SiCO Low k=4.5 Spacer Deposited at Low Temperature (400 C) in the perspective of 3D VLSI Integration, IEEE International Electron Devices Meeting, 2015, pp. 8.6.1-8.6.4.

K. Cheng et al., Forming A Hybrid Channel Nanosheet Semiconductor Structure, Unpublished U.S. Appl. No. 15/260,509, filed Sep. 9, 2016, pp. 1-15 plus 17 sheets formal drawings.

Yohei Ishii et al., Atomic layer etching of silicon nitride using cyclic process with hydrofluorocarbon chemistry, Japanese Journal of Applied Physics 56, 2017, p. 06HB07-1 to 06HB07-6.

\* cited by examiner

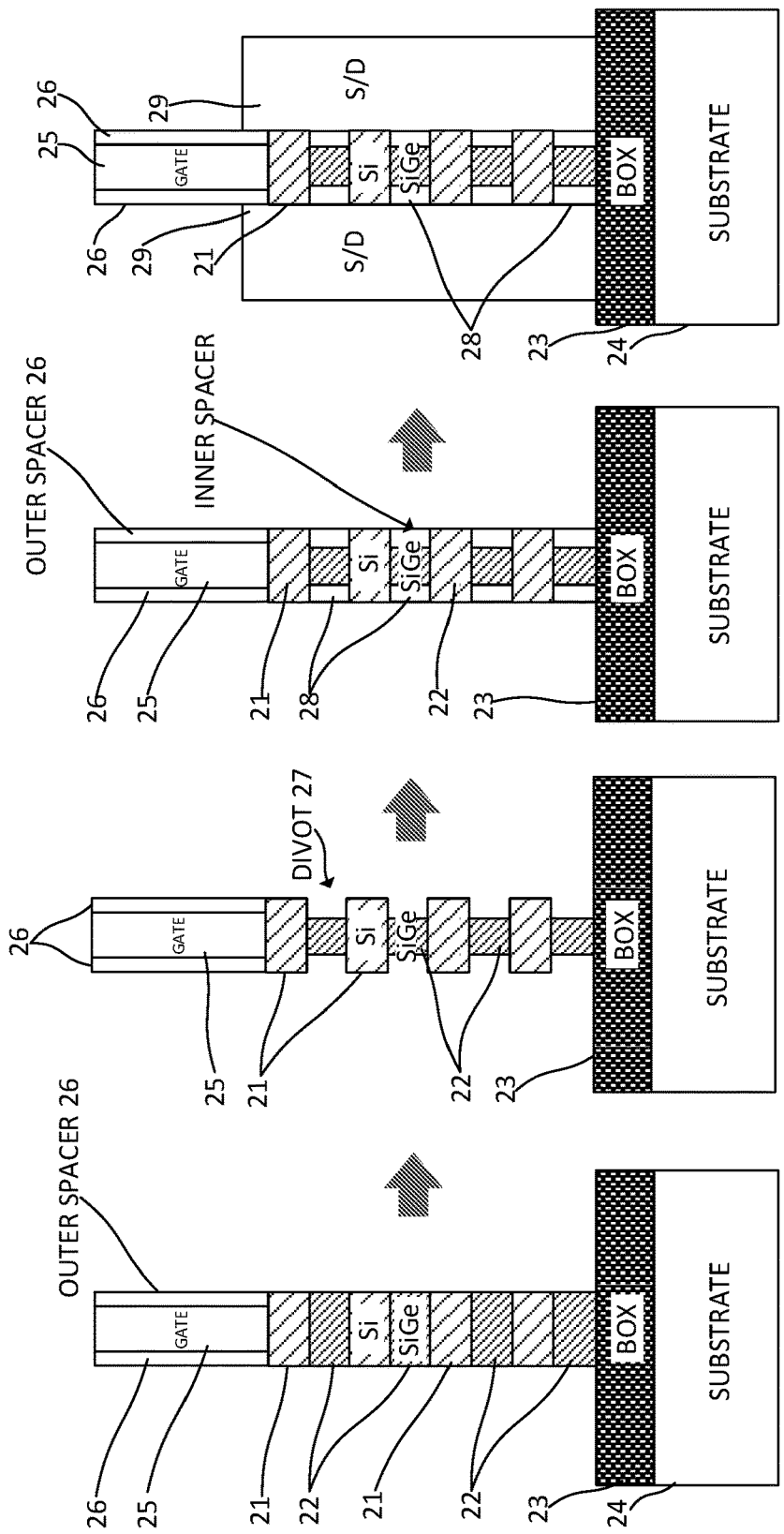

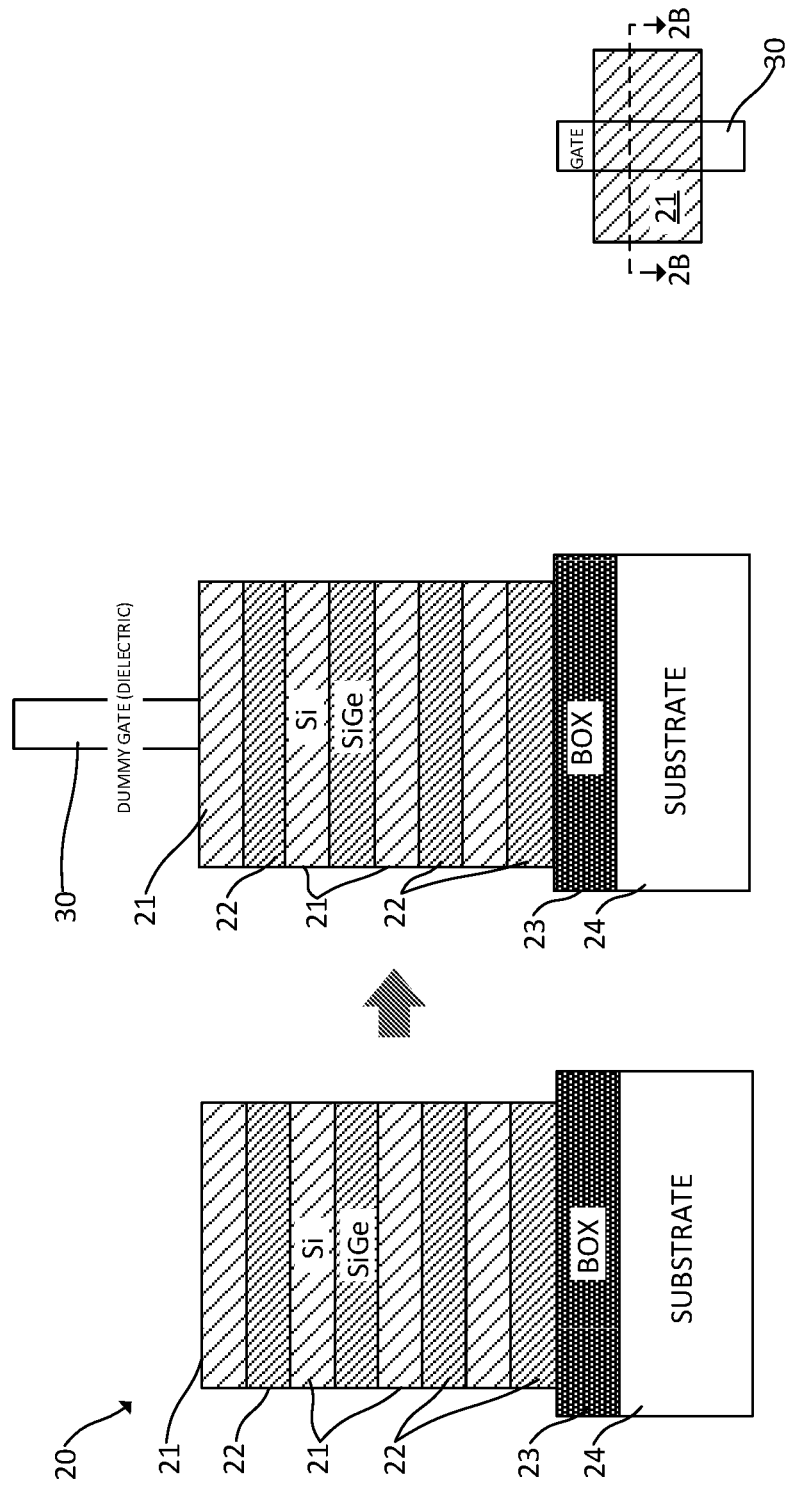

NANOSHEET TRANSISTOR

BACKGROUND

The present invention relates generally to the electrical, electronic and computer arts and, more particularly, to nanosheet transistors and the formation of spacers in such transistors.

With shrinking dimensions of various integrated circuit components, transistors such as field-effect transistors (FETs) have experienced dramatic improvements in both performance and power consumption. These improvements may be largely attributed to the reduction in dimensions of components used therein, which in general translate into reduced capacitance, resistance, and increased through-put current from the transistors. Metal oxide semiconductor field-effect transistors (MOSFETs) are well suited for use in high-density integrated circuits. As the size of MOSFETs and other devices decreases, the dimensions of source/drain regions, channel regions, and gate electrodes of the devices, also decrease.

Nanosheet FETs have been under development for possible use in tight pitch applications such as 7 nm nodes and beyond. Such FETs include multiple channel layers, each channel layer being separated by a gate stack including a layer of electrically conductive gate material and a gate dielectric layer. The gate stacks wrap around all sides of the channel layers, thereby forming a gate-all-around (GAA) structure. Epitaxial regions on the ends of the nanosheet channel layers form source/drain regions of the nanosheet FETs. Spacers are employed for electrically isolating the gates from the source/drain regions of nanosheet transistors. Nanosheet transistor spacers may include two portions, namely an outer spacer and an inner spacer.

BRIEF SUMMARY

An exemplary nanosheet field-effect transistor device includes a vertical stack of nanosheet channel layers. All-around gate stacks are operatively associated with the nanosheet channel layers. A gate electrode extends vertically from a top surface of the gate stack and includes vertical sidewalls. Epitaxial source/drain regions are operatively associated with the nanosheet channel layers. A dielectric liner has a first portion that extends over the source/drain regions and an outer spacer portion that extends over the vertical sidewalls of the gate electrode. An interlevel dielectric layer extends over the first portion of the dielectric liner.

A first exemplary method of fabricating a nanosheet field-effect transistor includes obtaining a structure including a vertical stack of nanosheet channel layers and sacrificial silicon germanium layers, the nanosheet channel layers and sacrificial silicon germanium layers being arranged in alternating sequence. A dielectric dummy gate is formed on the vertical stack. Portions of the vertical stack of nanosheet channel layers are recessed, thereby exposing first lateral edge portions of the channel layers and second lateral edge portions of the sacrificial silicon germanium layers. The first and second lateral edge portions are oxidized such that first oxide layers and second oxide layers are formed from the first lateral edge portions and the second lateral edge portions, respectively. The second oxide layers are greater in thickness than the first oxide layers. The first oxide layers are removed from the nanosheet channel layers. Source/drain regions are epitaxially grown on the nanosheet channel layers. The width of the dielectric dummy gate is narrowed and a dielectric material is deposited over the dummy gate and the source/drain regions, thereby forming a dielectric liner over the dummy gate and the source/drain regions. The dummy gate is removed to form a trench within the dielectric liner and the sacrificial silicon germanium layers are removed to form spaces between the nanosheet channel layers. A gate dielectric layer is formed within the trench and on the nanosheet channel layers and gate metal is deposited over the gate dielectric layer within the trench and within the spaces between the nanosheet channel layers.

A further method of fabricating a nanosheet field-effect transistor includes obtaining a structure including a vertical stack of nanosheet channel layers and sacrificial silicon germanium layers, the nanosheet channel layers and sacrificial silicon germanium layers being arranged in alternating sequence, epitaxial source/drain regions on the nanosheet channel layers, a plurality of end spaces, each end space being between one of the sacrificial silicon germanium layers and one of the source/drain regions, and a dielectric dummy gate having sidewalls extending vertically from a top surface of the vertical stack. A dielectric material is deposited over the dummy gate and the source/drain regions whereby the dielectric material further extends into the end spaces. The dielectric material thereby forms outer dielectric spacers over the sidewalls of the dummy gate, inner dielectric spacers between the sacrificial silicon germanium layers and the source/drain regions, and a dielectric liner over the source/drain regions. An interlevel dielectric layer is formed over the dielectric liner. The dielectric dummy gate is removed to form a trench within the outer dielectric spacers and the sacrificial silicon germanium layers are removed to form spaces between the nanosheet channel layers. A gate dielectric layer is formed within the trench and on the nanosheet channel layers. Gate metal is deposited over the gate dielectric layer within the trench and within the spaces between the nanosheet channel layers.

Techniques and structures as disclosed herein can provide substantial beneficial technical effects. By way of example only and without limitation, one or more embodiments may provide one or more of the following advantages:

Spacer formation without conventional spacer RIE or timed etch;

Improved junction uniformity;

Outer spacer, inner spacer and ILD liner can be formed of the same material;

Allows concurrent outer spacer and ILD liner formation.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIGS. 1A-1G are schematic, cross-sectional views showing sequential steps in a process of fabricating a nanosheet field-effect transistor;

FIG. 2A is a schematic, cross-sectional view showing a structure including stack of semiconductor nanosheets on an electrically insulating layer;

FIG. 2B is a schematic, cross-sectional view taken along line 2B-2B of FIG. 2C, and shows a structure following formation of a dummy gate on the structure shown in FIG. 2A;

FIG. 2C is a top plan view of the structure shown in FIG. 2B;

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Figure 1C:
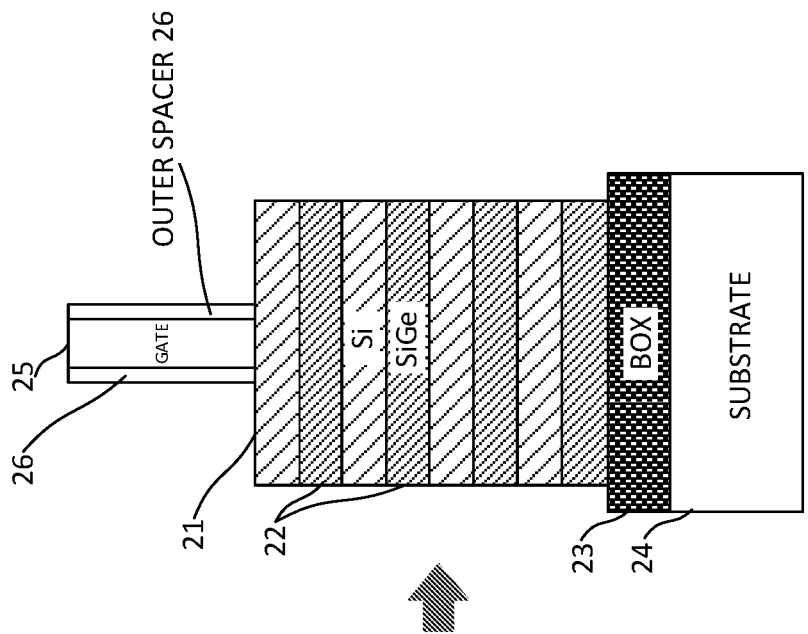
Figure 1B:
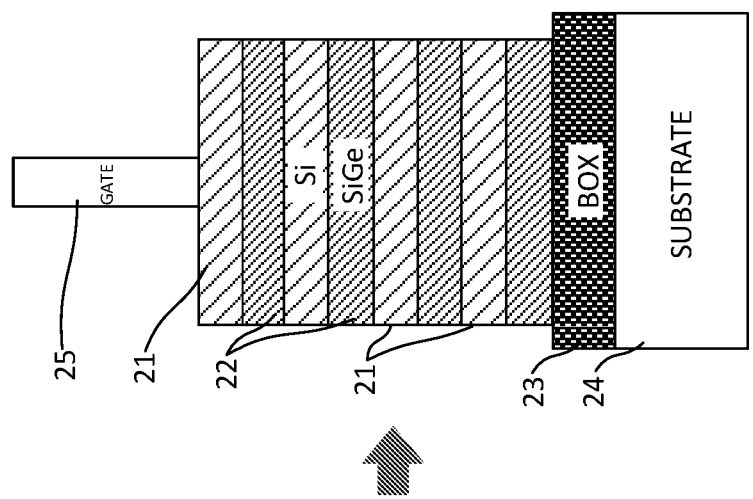

A sequence of steps that may be employed during fabrication of a nanosheet transistor is shown in FIGS. 1A-1G. The structure 20 shown in FIG. 1A includes a stack of semiconductor layers including, in alternating sequence, silicon layers 21 and silicon germanium layers 22. The semiconductor layers are formed on a semiconductor-on-insulator substrate. The bottom semiconductor layer adjoins a buried oxide (BOX) layer 23 which is on a semiconductor substrate 24. As shown in FIG. 1C, a dummy gate 25 is formed on the top surface of the stack of semiconductor layers. The dummy gate 25 is typically amorphous silicon or polycrystalline silicon. Outer spacers 26 are formed on the dummy gate. A conformal silicon nitride layer may be deposited on the structure and patterned to form the outer spacers. The dummy gate 25 and outer spacers 26 protect the underlying portion of the stack of semiconductor layers while the exposed portions thereof are removed to obtain the structure shown in FIG. 1D. The silicon germanium layers 22 are undercut by a timed etch to form divots 27 between the silicon layers 21, as shown in FIG. 1E. A conformal dielectric layer is deposited on the structure, thereby filling the divots. The conformal dielectric layer is subjected to a timed etch to remove the dielectric material outside the stack of semiconductor layers. The remaining dielectric material forms inner spacers 28 between the silicon layers 21, as shown in FIG. 1F. Source/drain semiconductor material 29 is then epitaxially grown on the exposed end portions of the silicon layers 21. A structure as shown in FIG. 1G is obtained at this stage of the process. A gate stack (not shown) is formed later in the process between the channel layers (silicon layers 21) of the structure by removing the dummy gate and replacing it with gate materials such as high-k gate dielectric and gate conductor. The timed etch of the silicon germanium layers is subject to the loading effect, causing variation in the inner spacer thickness and thus junction variation of the fabricated nanosheet transistors.

Figure 1A:
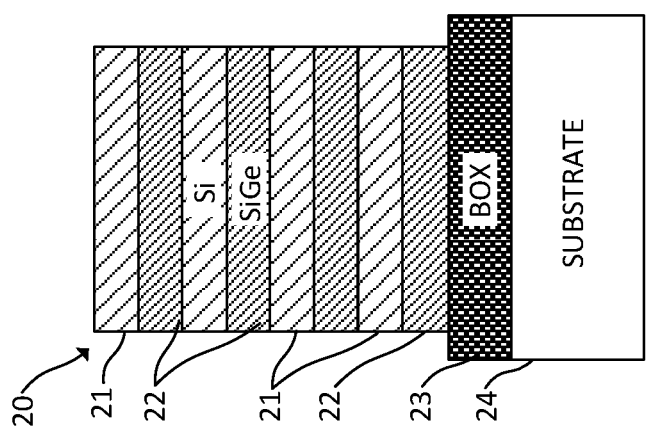

An improved method of fabricating nanosheet transistors helps avoid junction variation as described above. Starting with a structure 20 as shown in FIG. 2A, steps for performing a first exemplary fabrication process are shown sequentially in subsequent figures, as discussed below. The disclosed process may facilitate the fabrication of devices in the 7 nm mode and possibly beyond. FIG. 2A schematically depicts an exemplary monolithic semiconductor structure 20 as described above with respect to FIG. 1A. The same reference numerals employed in FIG. 1A are used in FIG. 2A to designate similar elements. While the exemplary fabrication process is described with respect to semiconductor layers formed on a semiconductor-on-insulator substrate, it will be appreciated that nanosheet transistors can alternatively be formed using a bulk semiconductor substrate such as a bulk silicon substrate. In one or more exemplary embodiments, the silicon layers 21 each have a thickness in the range of four to ten nanometers (4-10 nm). The number of silicon (channel) layers in the semiconductor layer stack may vary depending on the desired uses and capabilities of the nanosheet transistor to be fabricated. The silicon layers 21 consist essentially of monocrystalline silicon in some embodiments. The silicon germanium layers 22, which are replaced by metal gate and gate dielectric materials later in the process, may have a thickness in the range of six to twenty nanometers (6-20 nm). The dimension ranges of the channel layers and sacrificial silicon germanium layers should be considered exemplary as opposed to limiting. The silicon germanium layers 22 may have the composition $Si_{1-x}Ge_x$ where x is between 0.2 and 0.8. The silicon and silicon germanium layers can be epitaxially grown in alternating sequence to obtain a vertical stack having the desired number of silicon (channel) layers. The terms "epitaxially growing and/or depositing" and "epitaxially grown and/or deposited" mean the growth of a semiconductor material on a deposition surface of a semiconductor material in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Figure 3:
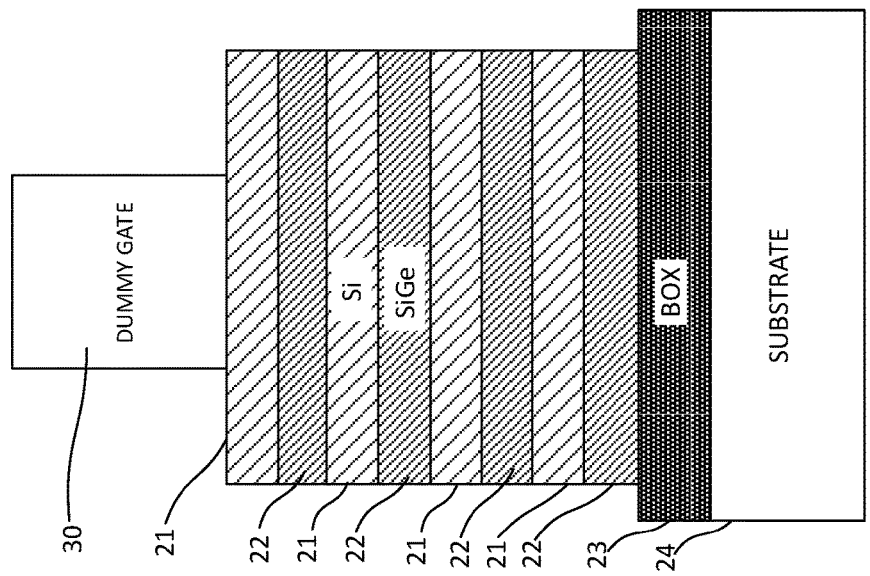
FIG. 3 is an enlarged view of the structure shown in FIG. 2B.

Referring to FIGS. 2A and 2B, a dielectric dummy gate 30 is formed on the top surface of the stack of semiconductor layers. The dummy gate can be formed by any suitable method, including depositing a conformal nitride layer and removing unwanted material using a patterning technique such as lithography in conjunction with reactive ion etching or plasma etching. A silicon nitride layer (not shown) can, for example, be deposited via CVD, PECVD, sputtering, or other suitable technique. The dummy gate 30 formed from the nitride layer is wider than the final (metal) gate that is formed later in the process. In contrast, in the process discussed above with respect to FIGS. 1A-1G, the starting dummy gate 25 has about the same as width as the final (metal) gate. The dummy gate 30 may consist essentially of dielectric material(s) other than silicon nitride, for example, silicon oxynitride, SiBCN (silicon borocarbonitride), SiOCN (silicon oxycarbonitride), and/or SiOC (silicon oxycarbide). The dummy gate 30 may consist a single layer or multiple layers of dielectric materials. FIG. 3 is an enlarged view of the structure including the dielectric dummy gate 30 shown in FIG. 2B. The bottom silicon germanium layer 22 adjoins the buried insulator layer 23, which may be a buried oxide layer. Other buried insulators such as silicon oxide, silicon nitride, silicon oxynitride, boron nitride (BN), aluminum oxide ($Al_2O_3$), or any suitable combination of those materials may alternatively be employed in some embodiments.

Figure 4:
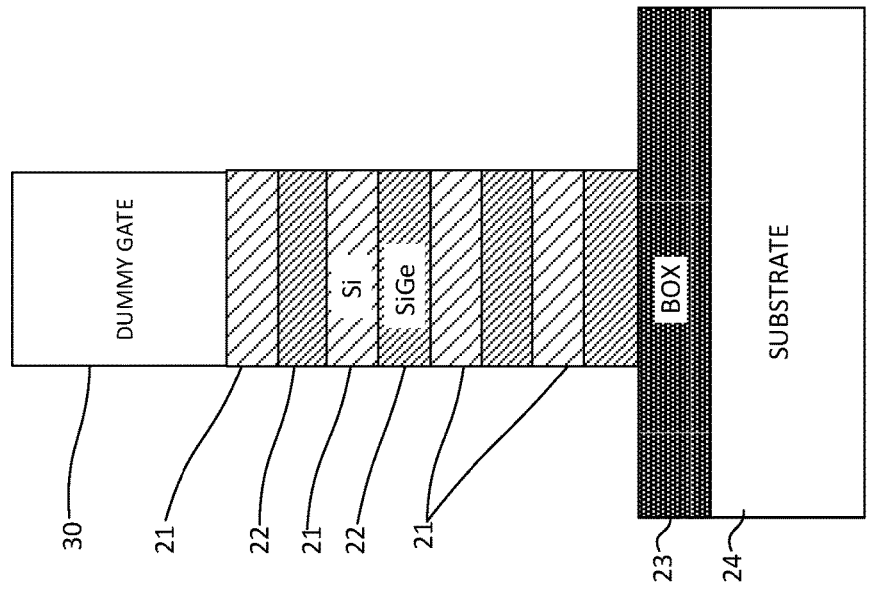
FIG. 4 is a schematic, cross-sectional view thereof following recessing of the nanosheets.

The dielectric dummy gate 30 functions as a protective mask and the buried insulator layer 23 functions as an etch stop during removal of the exposed portions of the semiconductor layers 21, 22. A reactive ion etch (ME) down to the buried insulator layer 23 may be employed to remove the semiconductor layers 21, 22 outside the outer sidewalls of the dielectric dummy gate 30. The portions of the semiconductor layers 21, 22 beneath the dummy gate 30 remain intact, as illustrated in FIG. 4.

Figure 6:
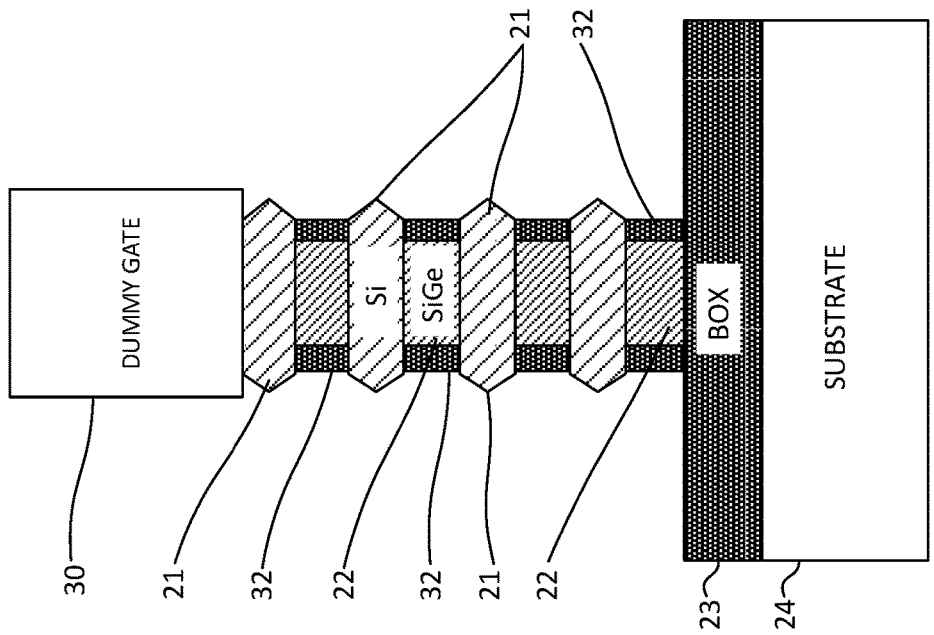
FIG. 6 is a schematic, cross-sectional view thereof following partial removal of the oxide layer.
Figure 5:
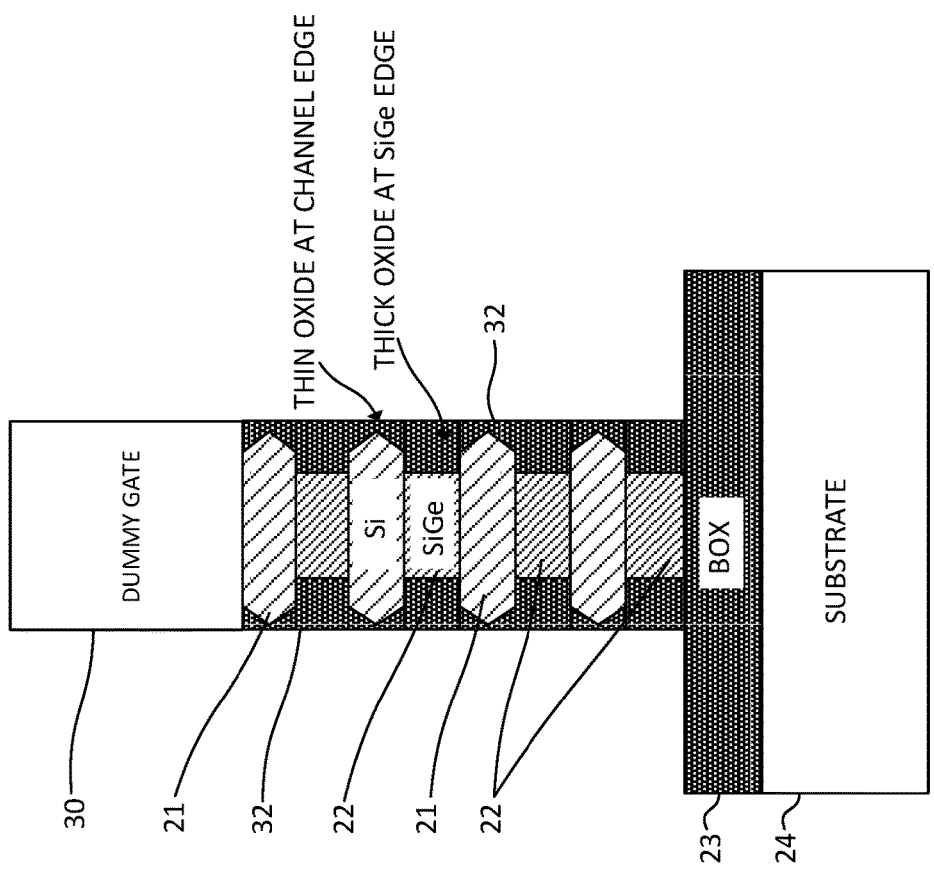
FIG. 5 is a schematic, cross-sectional view thereof following formation of an oxide layer.

Following semiconductor layer recessing, a low-temperature oxidation process conducted at less than 700° C. causes the oxidation of the exposed end portions of the silicon and silicon germanium layers. A wet oxidation conducted at 630° C. can be employed in the exemplary embodiment. $Si_{0.75}Ge_{0.25}$, for example, oxidizes at least ten times faster than silicon under such conditions. The oxide layer 32 formed during the oxidation process accordingly includes relatively thick oxide layer portions at the edges of the silicon germanium layers 22 and relatively thin oxide layer portions at the edges of the silicon layers 21, as shown in FIG. 5. The width of the silicon layers 21 following oxidation may be between ten and one hundred nanometers (10-100 nm). The edges of the silicon nanosheet (channel) layers 21 may be rounded as a result of the oxidation process. An epitaxy preclean process is employed to remove the thin layers of oxide material at the edges of the silicon layers 21. The edges of the silicon germanium layers 22 remain covered by oxide material following preclean. Oxide removal is conducted using, for example, a SiCoNi™ vapor phase etch process. A SiCoNi™ etch is a plasma-assisted dry etch process that involves simultaneous exposure of a substrate to hydrogen, $NF_3$ and $NH_3$ plasma by-products. The structure following epitaxy preclean is shown in FIG. 6. Oxide etch processes other than SiCoNi™ vapor phase etch process can be used, for example, a wet etch using a solution containing hydrofluoric acid, or a dry etch such as chemical oxide etch (COR). It is necessary to remove thin oxide from the edges of the silicon nanosheet layers 21 so that the exposed silicon edges can be used as the seed to epitaxially grow source/drain regions. Before epitaxial growth, there is typically an oxide etch process to clean the semiconductor surface. Those two etch processes can be done separately using two separate process steps. Alternatively, a single oxide etch can be used to serve those two purposes at the same time: removing the thin oxide and cleaning the surfaces of semiconductor before epitaxy.

Figure 7:
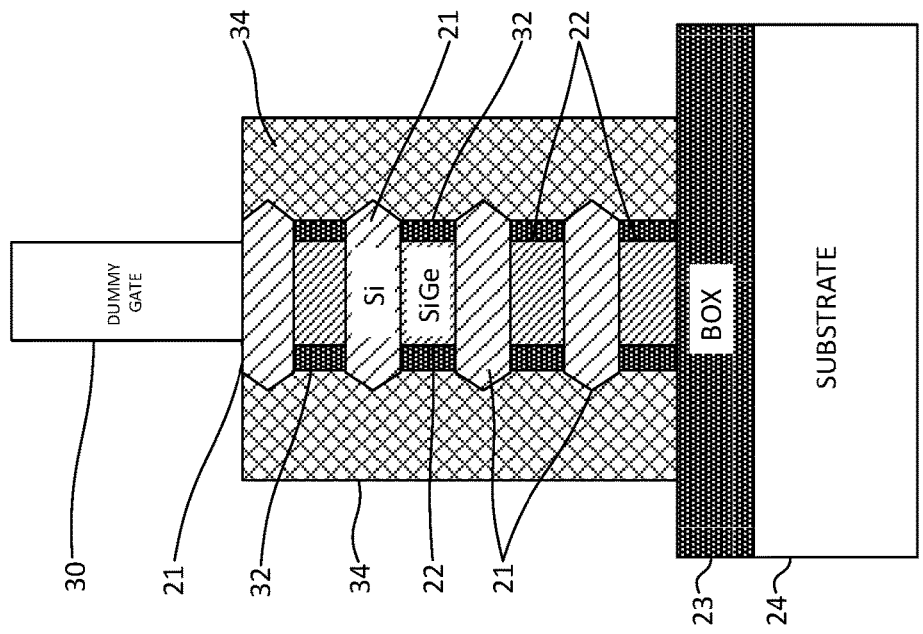
FIG. 7 is a schematic, cross-sectional view thereof following epitaxial growth of source/drain semiconductor material.

As shown in FIG. 7, source/drain regions 34 are epitaxially grown on the exposed edges of the silicon layers 21. The relatively thick portions of the oxide layer 32 isolate the silicon germanium layers 22 from the source/drain epitaxy. Dopants may be incorporated in situ using appropriate precursors, as known in the art. By "in-situ" it is meant that the dopant that dictates the conductivity type of a doped layer is introduced during the process step, for example epitaxial deposition, that forms the doped layer. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. In a silicon-containing substrate, examples of n-type dopants, i.e., impurities, include but are not limited to antimony, arsenic and phosphorous. Exemplary epitaxial growth processes that are suitable for use in forming silicon and/or silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The source/drain epitaxial process is selective to dielectric materials such as silicon nitride, so the epitaxial material does not grow on the dummy (e.g. silicon nitride) gate 30.

A directional etch is employed to reduce the width of the dummy gate 30. An atomic layer etch (ALE) is employed in some embodiments. Atomic layer etching is a film etching technique that uses sequential self-limiting reactions to reduce the dimensions of a substrate. ALE techniques have been developed for the removal of silicon nitride without damaging silicon. "Atomic layer etching of silicon nitride using cyclic process with hydrofluorocarbon chemistry" by Y. Ishii et al., Japanese Journal of Applied Physics, Year: 2017, volume: 56, page: 06HB07, incorporated by reference herein, discloses an ALE technique for etching silicon nitride selective to silicon by applying adsorption and desorption processes alternately in a cyclic process. $CH_3F$/Ar plasma without RF bias is applied as an adsorption process to deposit a hydrofluorocarbon (HFC) layer on the targeted surfaces. Ar plasma with RF bias is applied as a desorption process to remove the target materials with the HFC layer. In the adsorption process, the flow rates of $CH_3F$ and Ar gases are three (3) and one hundred forty (140) ml/minute, respectively. Ar gas flow of 150 ml/minute is used in the desorption process. Microwave source powers in the adsorption and desorption processes are four hundred and three hundred fifty watts, respectively in the Ishii et al. process. Wafer temperatures are 45° C. and 30° C. respectively in the adsorption and desorption processes.

Figure 8:
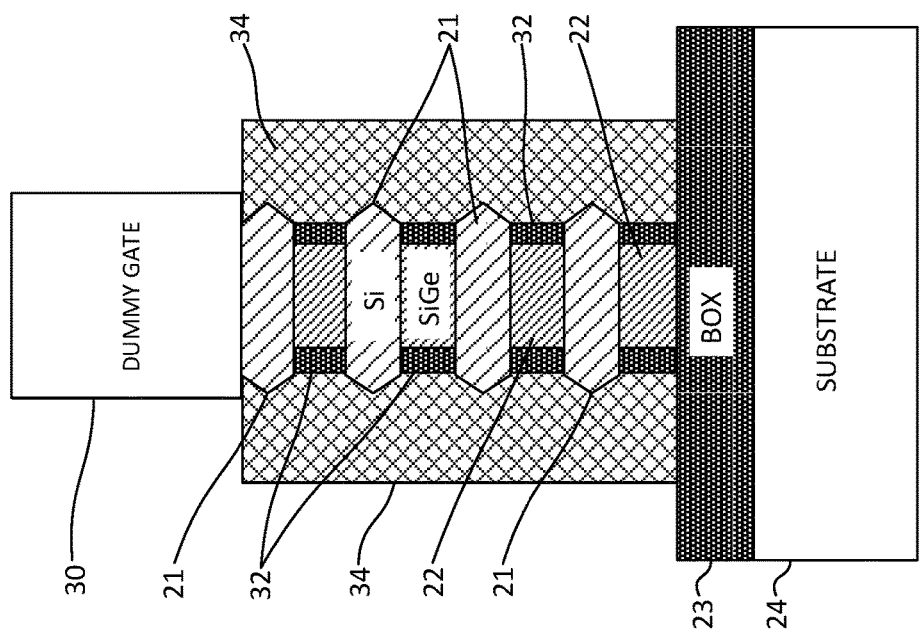
FIG. 8 is a schematic, cross-sectional view thereof following narrowing of the dummy gate.

The width of the dummy gate, once reduced, is less than the widths of the silicon (channel) layers 21 within the structure. The portions of the oxide material 32 previously formed on the silicon germanium layers 22 will also no longer be directly beneath the bottom surface of the dummy gate, as shown in FIG. 8.

Figure 9:
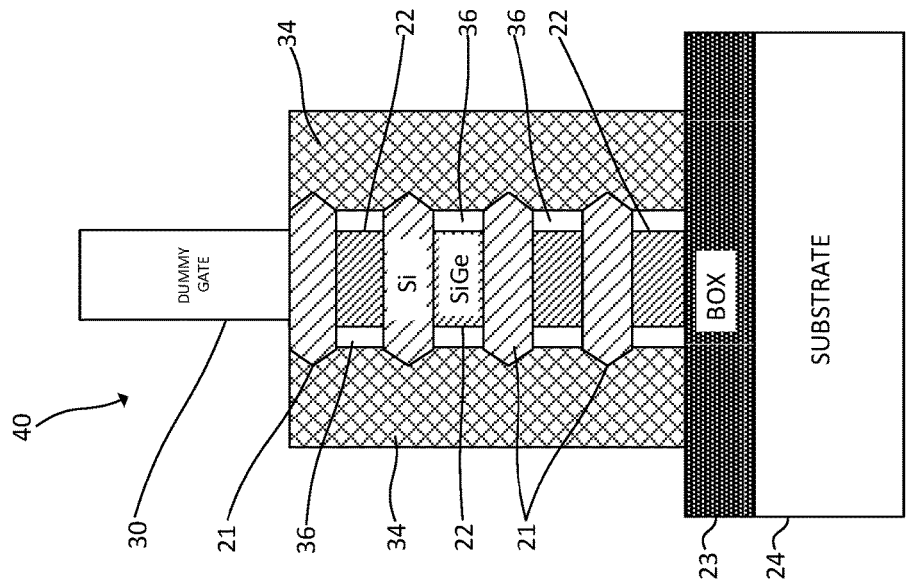
FIG. 9 is a schematic, cross-sectional view showing the structure of FIG. 8 following the optional removal of the remaining oxide material.

The oxide material 32 on the silicon germanium layers 22 is optionally removed to obtain a structure 40 as shown in FIG. 9. Etching of the oxide material may be conducted using a diluted hydrofluoric acid (HF) solution or any other suitable selective etch process. Alternatively, a COR process or a SiCoNi™ etch can be used to remove the oxide material. The removal of the oxide material creates end spaces 36 adjoining the silicon germanium layers 22 and located between the silicon (channel) layers 21.

Figure 10:
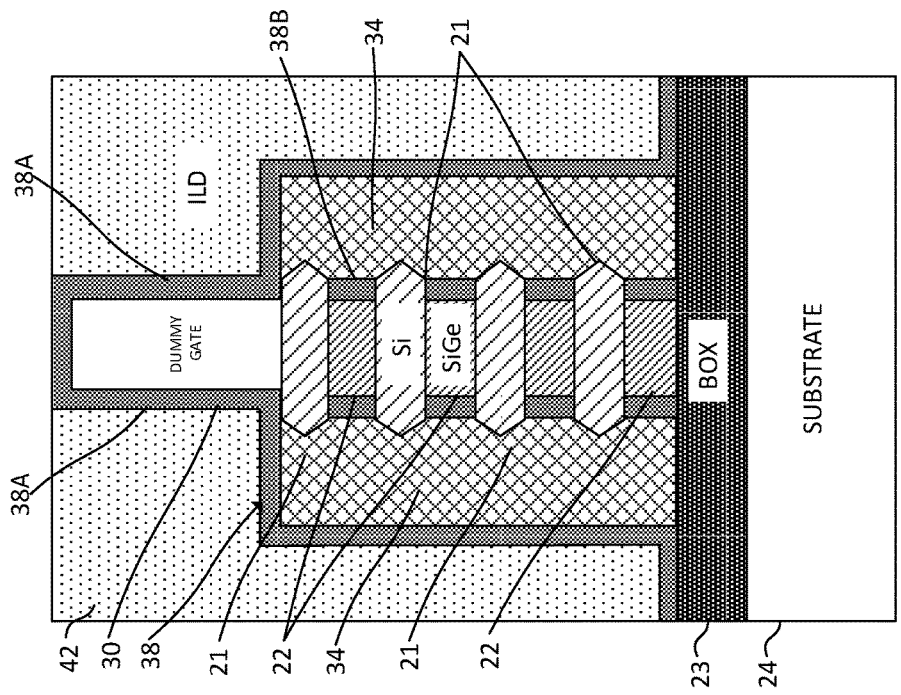
FIG. 10 is a schematic, cross-sectional view thereof following conformal deposition of a dielectric material.

In accordance with a first exemplary process that follows the optional removal of the oxide material 32, a dielectric material is conformally deposited on the structure 40. The deposited dielectric material forms a liner 38 on the dummy gate 30, the source/drain regions 34, and the BOX layer 23, as shown in FIG. 10. It also forms inner dielectric spacers 38B that fill the end spaces 36 between the silicon germanium layers 22 and the source/drain regions 34. The portions of the dielectric liner 38 on the vertical sidewalls of the dummy gate 30 can later function as outer spacers 38A of the completed nanosheet transistor. In some embodiments, a conformal SiCO (silicon carboxide) liner is deposited using chemical vapor deposition (CVD). SiCO has a dielectric constant of 4.5. Other dielectric materials having similar dielectric constants may also be considered for forming the dielectric liner 38. The thickness of the dielectric liner 38 is between four and eight nanometers (4-8 nm) in an exemplary embodiment. An interlevel dielectric (ILD) layer 42 is deposited on the resulting structure and planarized. The SiCO or other dielectric material layer functions as a liner for the ILD layer, also shown in FIG. 10. The ILD layer 42 may be formed from any suitable dielectric material, including but not limited to spin-on-glass, a flowable oxide, a high density plasma oxide, borophosphosilicate glass (BPSG), or any combination thereof. The ILD layer is deposited by any suitable deposition process including but not limited to CVD, PVD, plasma-enhanced CVD, atomic layer deposition (ALD), evaporation, chemical solution deposition, or like processes. The ILD layer is planarized using chemical mechanical planarization (CMP) down to the dielectric liner to obtain a structure as schematically illustrated in FIG. 10. Etching (RIE) of the conformally deposited dielectric liner 38 is not required.

Figure 12:
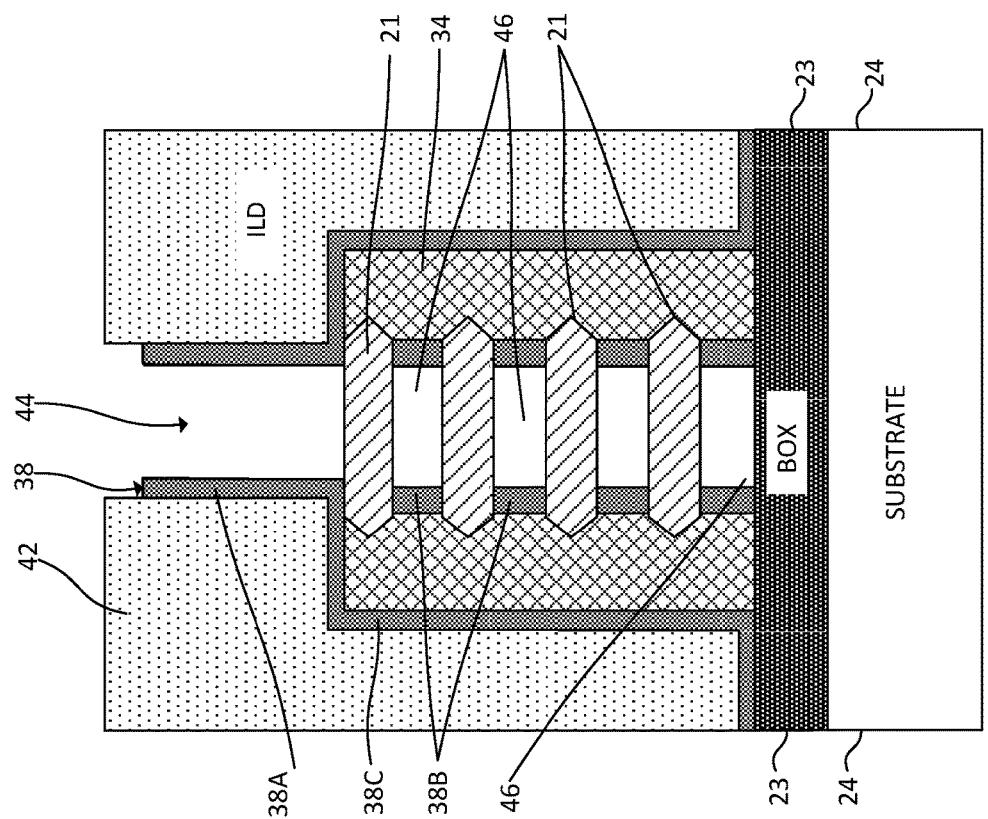
FIG. 12 is a schematic, cross-sectional view thereof following removal of selected semiconductor nanosheets from the structure shown in FIG. 11.
Figure 11:
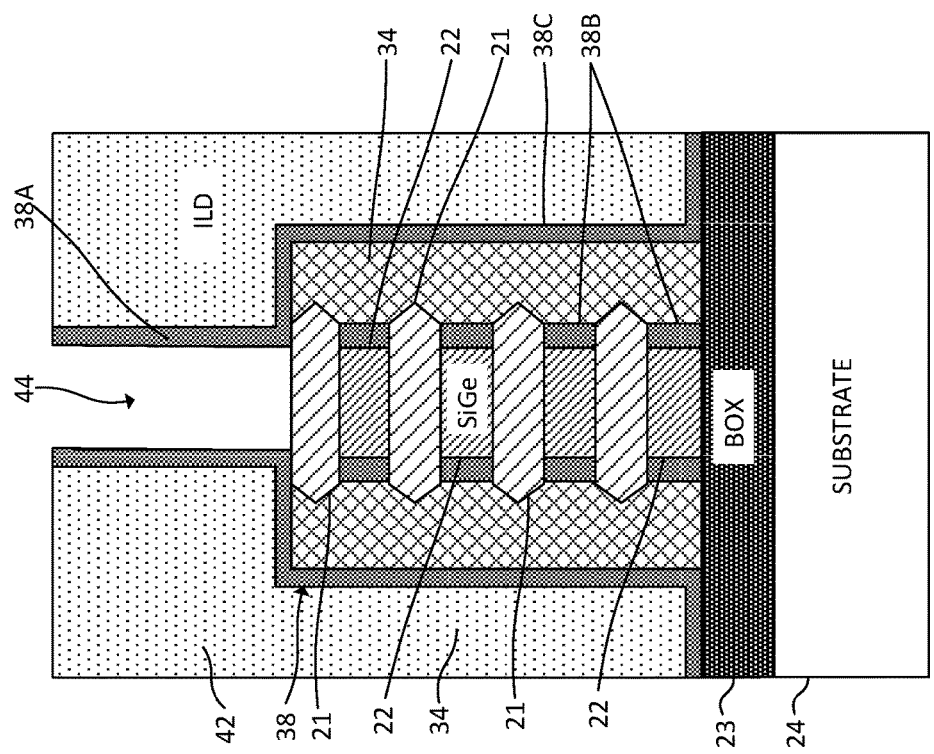
FIG. 11 is a schematic, cross-sectional view thereof following formation of a trench in the dielectric material and removal of the dummy gate from the structure shown in FIG. 10.

Referring to FIG. 11, a recess is formed in the dielectric liner 38 and the remaining portion of dummy gate 30 is removed to form a trench 44 extending down to the top surface of the stack of semiconductor layers. In an exemplary embodiment, a nitride dummy gate 30 may be removed using hot phosphoric acid or other suitable etching technique that is selective to SiCO and silicon. The top surface of a silicon nanosheet is thereby exposed at the bottom of the trench 44. The silicon germanium layers 22 are then removed using an etching process that is selective to the silicon nanosheets 21. Hydrogen chloride gas is employed in some embodiments to selectively remove silicon germanium, leaving the silicon nanosheets 21 substantially intact. Alternatively, a wet etch process containing ammonia and hydroperoxide can be used to etch SiGe selective to other materials. As shown in FIG. 12, horizontal spaces 46 are formed between the silicon (channel) nanosheet layers 21 as well as between the bottom silicon nanosheet layer 21 and the electrically insulating (e.g. BOX) layer 23.

Figure 13:
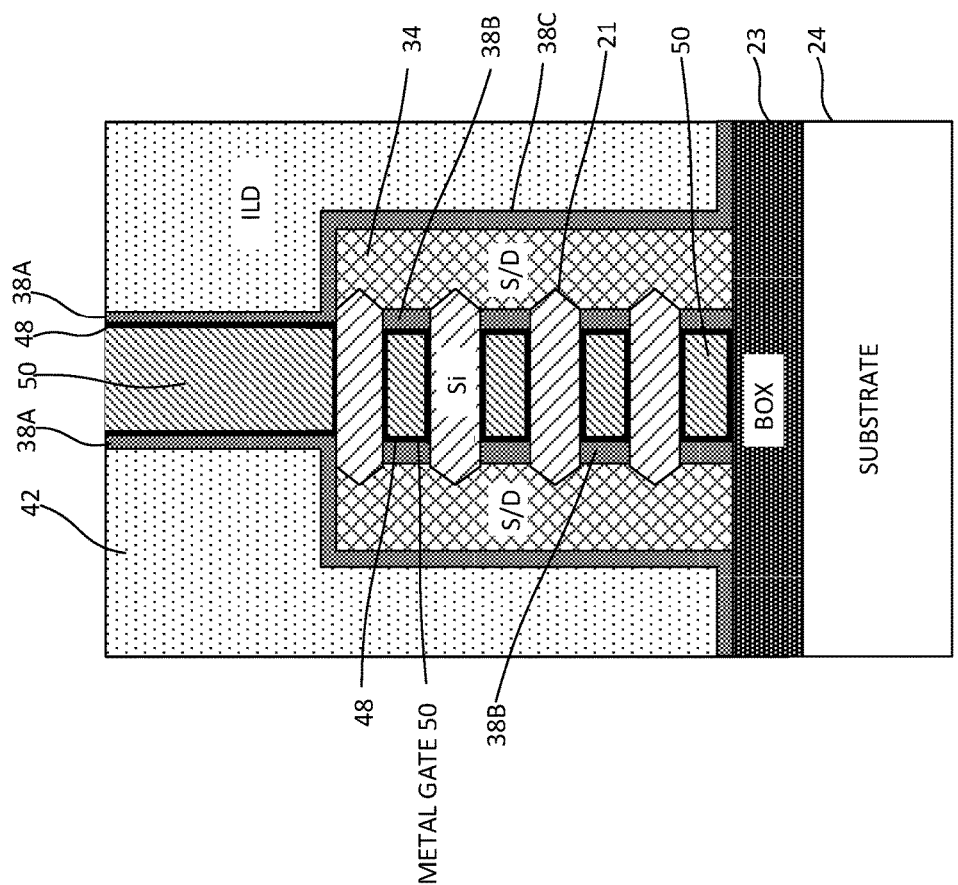
FIG. 13 is a schematic, cross-sectional view thereof following deposition of gate dielectric and metal gate materials on the structure shown in FIG. 12.

Gate stacks are formed in adjoining relation to the silicon nanosheet (channel) layers 21, thereby obtaining a structure 60 as schematically illustrated in FIG. 13. A gate dielectric layer 48 forms portions of the gate stacks that replace the sacrificial silicon germanium layers 22. The gate stacks adjoin the silicon nanosheet channel layers 21 and the "inner spacer" and "outer spacer" portions 38B, 38A of the dielectric liner 38. As portions of the gate dielectric layer 48 are formed on the outer spacers 38A as well as the channel layers 21, such portions are accordingly positioned between the vertical sidewall portions of the gate metal that extends vertically above the top surface of the stack of nanosheet channel layers 21 and the vertically extending inner spacers 38A. Non-limiting examples of suitable materials for the gate dielectric layer 48 include oxides, nitrides, oxynitrides, silicates (e.g., metal silicates), aluminates, titanates, nitrides, or any combination thereof. Examples of high-k gate dielectric materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric layer 56 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material may vary depending on the deposition process as well as the composition and number of high-k dielectric materials used. In some embodiments, the gate dielectric layer 48 includes multiple layers.

Electrically conductive gate material is deposited in the trench 44 formerly containing the narrowed dummy gate 30 and the spaces 46 formerly filled by the silicon germanium layers 22. The deposited metal gate material forms the metal gate 50 of the nanosheet field-effect transistor, as shown in FIG. 13, including a gate electrode portion within the outer spacers 38A that extends vertically above the stack of nanosheet channel layers. Non-limiting examples of suitable electrically conductive metals for forming the metal gate include aluminum (Al), platinum (Pt), gold (Au), silver (Ag), tungsten (W), titanium (Ti), cobalt (Co), or any combination thereof. The gate metal may be deposited using processes such as CVD, PECVD, PVD, plating, or thermal or e-beam evaporation. A planarization process, for example, chemical mechanical planarization (CMP), is performed to polish the top surface of the deposited gate metal material that may form on the structure.

In some embodiments, the electrically conductive gate includes a work function metal (WFM) layer (not shown) disposed between the gate dielectric layer and another electrically conductive metal gate material. The WFM sets the transistor characteristics such as threshold voltage (Vt) to a predetermined value. In some embodiments, the WFM serves dual purposes: Vt setting and gate conductor. Non-limiting examples of suitable work function metals include p-type work function metal materials and n-type work function metal materials. P-type work function materials include compositions such as ruthenium, palladium, platinum, cobalt, nickel, and conductive metal oxides, titanium nitride, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, a conformal ALD process. The nanosheet FET structure at this stage of the exemplary fabrication process includes channel layers 21, operatively associated gate stacks (48, 50), and doped epitaxial source/drain regions 34. In this embodiment, the outer spacers (the material surrounding the gate metal and gate dielectric layers above the top channel layer 21), the inner spacer (the dielectric material between pairs of channel layers 21) and the ILD liner consist essentially of the same material, for example SiCO. The outer spacers, inner spacers and ILD liner portions of the dielectric liner 38 are designated by numerals 38A, 38B and 38C, respectively, in FIG. 13.

Figure 14:
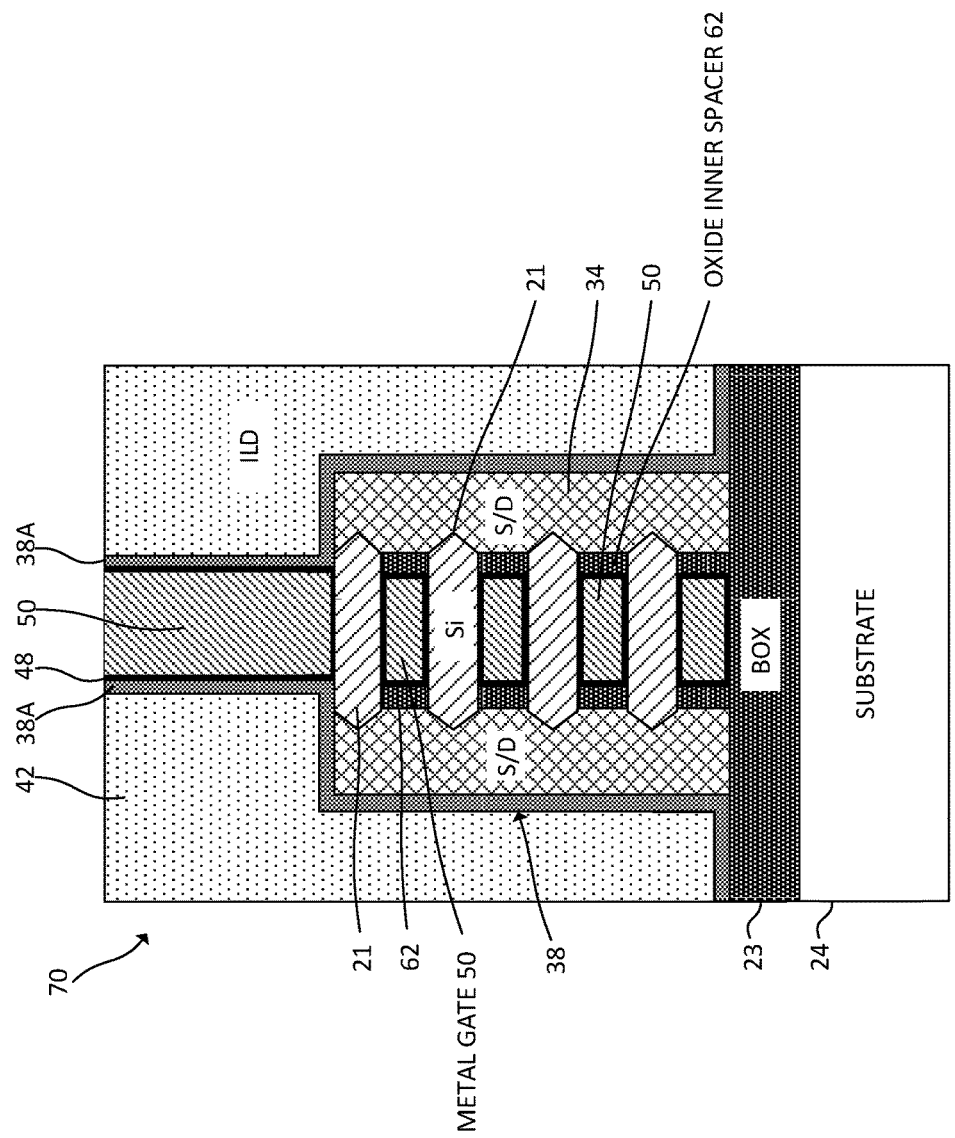
FIG. 14 is a schematic, cross-sectional view of an alternative embodiment of a nanosheet field-effect transistor including oxide layers between semiconductor nanosheets.

In an alternative fabrication process, the steps described above are performed essentially as described except for the removal of the oxide material 32 on the silicon germanium layers 22. The oxide material will accordingly form the "inner spacers" 62 of the nanosheet transistor while portions 38A of the dielectric liner 38 form the "outer spacers" and ILD liner 38C thereof. FIG. 14 schematically illustrates a monolithic structure 70 including a nanosheet transistor fabricated by omitting the oxide removal step prior to dielectric liner (e.g. SiCO) deposition. Like the first-described fabrication process for fabricating the monolithic structure 60 shown in FIG. 13, neither conventional spacer RIE nor a timed SiGe etch is required to obtain the structure 70. Both processes facilitate improving junction uniformity.

The drawing figures as discussed above depict exemplary processing steps/stages in the fabrication of exemplary structures. Although the overall fabrication methods and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling* 1$^{st}$ *Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

Given the discussion thus far, it will be appreciated that, in general terms, an exemplary method of fabricating a nanosheet field-effect transistor includes obtaining a structure 20 including a vertical stack of nanosheet channel layers 21 and sacrificial silicon germanium layers 22, the nanosheet channel layers and sacrificial silicon germanium layers being arranged in alternating sequence. Such a structure is shown in FIG. 2A. A dielectric dummy gate 30 is formed on the vertical stack. Portions of the vertical stack are recessed as illustrated in FIG. 4, thereby exposing first lateral edge portions of the channel layers 21 and second lateral edge portions of the sacrificial silicon germanium layers 22. The first and second lateral edge portions are oxidized such that first oxide layers and second oxide layers are formed from the first lateral edge portions and the second lateral edge portions, respectively. The second oxide layers are greater in thickness than the first oxide layers, as indicated in FIG. 5. The first oxide layers are removed from the nanosheet channel layers to obtain a structure as illustrated in FIG. 6. Source/drain regions 34 are epitaxially grown on the nanosheet channel layers following removal of the oxide material. The width of the dielectric dummy gate 30 is narrowed, as shown in FIG. 8, and a dielectric material is deposited over the dummy gate and the source/drain regions, thereby forming a dielectric liner 38 over the dummy gate and the source/drain regions. The dummy gate is removed to form a trench 44 as shown in FIG. 11 within an outer spacer portion 38A of the dielectric liner 38 and the sacrificial silicon germanium layers 22 are removed to form spaces 46 between the nanosheet channel layers, as shown in FIG. 12. A gate dielectric layer 48 is formed within the trench and on the nanosheet channel layers 21 and gate metal 50 is deposited over the gate dielectric layer within the trench 44 and within the spaces 46 between the nanosheet channel layers 21. Nanosheet field-effect transistor devices as shown in FIGS. 13 and 14 can accordingly be obtained. In embodiments wherein the second oxide layers formed on the sacrificial layers 22 are removed, the dielectric material deposited over the dummy gate and source/drain regions can be used to form the inner spacers of the transistor, as shown in FIG. 13. Alternatively, the second oxide layers may remain to form the inner spacers, as shown in FIG. 14.

A further method of fabricating a nanosheet field-effect transistor includes obtaining a structure including a vertical stack of nanosheet channel layers 21 and sacrificial silicon germanium layers 22, the nanosheet channel layers and sacrificial silicon germanium layers being arranged in alternating sequence, epitaxial source/drain regions 34 on the nanosheet channel layers, a plurality of end spaces 36, each end space being between one of the sacrificial silicon germanium layers 22 and one of the source/drain regions 34, and a dielectric dummy gate 30 having sidewalls extending vertically from a top surface of the vertical stack. FIG. 9 schematically illustrates such a structure 40. A dielectric material is deposited over the dummy gate and the source/drain regions whereby the dielectric material further extends into the end spaces. The dielectric material thereby forms outer dielectric spacers 38A over the sidewalls of the dummy gate, inner dielectric spacers 38B between the sacrificial silicon germanium layers 22 and the source/drain regions 34, and a dielectric liner 38C over the source/drain regions. An interlevel dielectric layer 42 is formed over the dielectric liner 38C. The dielectric dummy gate 30 is removed to form a trench 44 within the outer dielectric spacers 38A and the sacrificial silicon germanium layers 22 are removed to form spaces 46 between the nanosheet channel layers 21, as shown in FIG. 12. A gate dielectric layer 48 is formed within the trench 44 and on the nanosheet channel layers 21. Gate metal 50 is deposited over the gate dielectric layer within the trench and within the spaces 46 between the nanosheet channel layers 21. A structure 60 including a nanosheet field-effect transistor device may be obtained.

An exemplary nanosheet field-effect transistor device includes a vertical stack of nanosheet channel layers 21. All-around gate stacks including gate metal and gate dielectric layers are operatively associated with the nanosheet channel layers. A gate electrode 50 extends vertically from a top surface of the gate stack and includes vertical sidewalls. Epitaxial source/drain regions 34 are operatively associated with the nanosheet channel layers 21. A dielectric liner 38 has a first portion 38C that extends over the source/drain regions and an outer spacer portion 38A that extends over the vertical sidewalls of the gate electrode. An interlevel dielectric layer 42 extends over the first portion of the dielectric liner. Optionally, the dielectric liner 38 further comprises an inner spacer portion 38B that electrically isolates the source/drain regions 34 from the gate stacks, as shown in FIG. 13. In another embodiment, an oxide layer 62 as shown in FIG. 14 forms the inner spacer.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having nanosheet FET devices formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments may be referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" and "vertical" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b). It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method of fabricating a nanosheet field-effect transistor, comprising:
    obtaining a structure including a vertical stack of nanosheet channel layers and sacrificial silicon germanium layers, the nanosheet channel layers and sacrificial silicon germanium layers being arranged in alternating sequence;
    forming a dielectric dummy gate on the vertical stack;
    recessing portions of the vertical stack, thereby exposing first lateral edge portions of the channel layers and second lateral edge portions of the sacrificial silicon germanium layers;
    oxidizing the first lateral edge portions and the second lateral edge portions, wherein first oxide layers and second oxide layers are formed from the first lateral edge portions and the second lateral edge portions, respectively, the second oxide layers having greater thickness than the first oxide layers;
    removing the first oxide layers from the nanosheet channel layers;

epitaxially growing source/drain regions on the nanosheet channel layers;

narrowing the width of the dielectric dummy gate;

depositing a dielectric material over the dummy gate and the source/drain regions, thereby forming a dielectric liner over the dummy gate and the source/drain regions;

removing the dummy gate to form a trench within the dielectric liner;

removing the sacrificial silicon germanium layers to form spaces between the nanosheet channel layers;

forming a gate dielectric layer within the trench and on the nanosheet channel layers; and depositing gate metal over the gate dielectric layer within the trench and within the spaces between the nanosheet channel layers.

2. The method of claim 1, wherein the nanosheet channel layers consist essentially of monocrystalline silicon.

3. The method of claim 1, further including:
depositing an interlevel dielectric layer on the dielectric liner.

4. The method of claim 3, wherein the dielectric liner consists essentially of SiCO.

5. The method of claim 3, wherein forming the gate dielectric layer further includes causing portions of the gate dielectric layer to adjoin the second oxide layers.

6. The method of claim 3, wherein:
the structure further includes a substrate and a dielectric surface layer on the substrate, the vertical stack extending vertically from the dielectric surface layer, and further wherein recessing portions of the vertical stack include removing the portions of the vertical stack down to the dielectric surface layer.

7. The method of claim 1, further including:
removing the second oxide layers from the sacrificial silicon germanium layers, thereby forming end spaces adjoining each sacrificial silicon germanium layer, wherein:
depositing the dielectric material to form the dielectric liner further includes causing the dielectric material to form inner dielectric spacers within the end spaces, and
forming the gate dielectric layer further includes causing portions of the gate dielectric layer to adjoin the dielectric liner within the end spaces.

8. The method of claim 7, wherein the dielectric liner consists essentially of SiCO.

9. The method of claim 1, wherein narrowing the width of the dielectric dummy gate causes the width of the dielectric dummy gate to be less than the distance between the first lateral edge portions of the channel layers.

10. The method of claim 9, further including forming dielectric inner spacers between the nanosheet channel layers from the second oxide layers or the dielectric material forming the dielectric liner.

11. A method of fabricating a nanosheet field-effect transistor, comprising:
obtaining a structure including:
a vertical stack of nanosheet channel layers and sacrificial silicon germanium layers, the nanosheet channel layers and sacrificial silicon germanium layers being arranged in alternating sequence,
epitaxial source/drain regions on the nanosheet channel layers,
a plurality of end spaces, each end space being between one of the sacrificial silicon germanium layers and one of the source/drain regions, and
a dielectric dummy gate having sidewalls extending vertically from a top surface of the vertical stack;
depositing a dielectric material over the dummy gate and the source/drain regions whereby the dielectric material further extends into the end spaces, thereby forming outer dielectric spacers over the sidewalls of the dummy gate, inner dielectric spacers between the sacrificial silicon germanium layers and the source/drain regions, and a dielectric liner over the source/drain regions;
forming an interlevel dielectric layer over the dielectric liner;
removing the dielectric dummy gate to form a trench within the outer dielectric spacers;
removing the sacrificial silicon germanium layers to form spaces between the nanosheet channel layers;
forming a gate dielectric layer within the trench and on the nanosheet channel layers; and
depositing gate metal over the gate dielectric layer within the trench and within the spaces between the nanosheet channel layers.

12. The method of claim 11, wherein the widths of the nanosheet channel layers exceed the width of the dielectric dummy gate.

13. The method of claim 12, wherein depositing the dielectric material includes conformally depositing SiCO.

* * * * *